United States Patent [19]
Brown

[11] Patent Number: 5,635,880
[45] Date of Patent: Jun. 3, 1997

[54] CMOS MICROWAVE MULTIPHASE VOLTAGE CONTROLLED OSCILLATOR

[75] Inventor: Anthony K. D. Brown, Kanata, Canada

[73] Assignee: Northern Telecom Limited, Montreal, Canada

[21] Appl. No.: 615,909

[22] Filed: Mar. 14, 1996

[51] Int. Cl.$^6$ ............... H03B 5/02; H03F 3/193; H03F 3/45
[52] U.S. Cl. ............. 331/108 B; 330/253; 330/260; 331/135; 331/177 R; 333/215
[58] Field of Search ............. 331/57, 108 B, 331/135, 177 R; 333/213, 214, 215; 330/253, 260

[56] References Cited

U.S. PATENT DOCUMENTS

| | | | |
|---|---|---|---|
| 5,172,076 | 12/1992 | Brown | 331/57 |
| 5,185,581 | 2/1993 | Brown | 330/254 |
| 5,371,475 | 12/1994 | Brown | 330/254 |

OTHER PUBLICATIONS

"A 22 Gb/s Decision Circuit and a 32 Gb/s Regenerating Demultiplexer IC Fabricated in Silicon Bipolar Technology", J. Hauenschild et al, IEEE 1992 Bipolar Circuits & Technology Meeting, Paper 7.4, 1992, pp. 151–154.

"Design Considerations in High–Frequency CMOS Transconductance Amplifier Capacitor (TAC) Filters", F. Krummenacher, 1989 IEEE International Symposium on Circuits and Systems, 1989, pp. 100–105.

*Primary Examiner*—Siegfried H. Grimm
*Attorney, Agent, or Firm*—Aprilia U. Diaconescu

[57] ABSTRACT

A microwave differential amplifier comprises a first and a second matched NMOS device, each connected with the source to a common bias node, the gate to an input port for receiving a differential input signal and with the drains to an output port for providing a differential output signal. The Miller capacitors of each device provide the necessary feedback between the input and output ports for shifting the phase of the differential output signal with respect to the phase of the differential input signal with 45° at a predetermined frequency. The operating point of the NMOS devices is maintained in the linear region of the respective transfer characteristic, using matched loads and a corresponding bias current. The loads may be resistors, in which case AGC is used for maintaining a constant bias current, or active loads. A VCO built with four such differential amplifiers in a gyrator configuration oscillates at the predetermined frequency and has eight output signals. The VCO may be used in circuits providing multiphase data regeneration where the number of data transitions exceeds the number of clock transitions in a given time period.

26 Claims, 9 Drawing Sheets

CMOS MICROWAVE MULTIPHASE VOLTAGE CONTROLLED OSCILLATOR

BACKGROUND OF THE INVENTION

1. Field of the Invention

This invention relates to differential amplifiers and to high frequency resonators constructed from such differential amplifiers, and more particularly to a CMOS microwave multiphase voltage controlled oscillator.

2. Background Art

With the advent of the information era and the current interest in broadband data connections to the home, low cost, low power data receivers are required to interface with wideband data transport media. Such data receivers are required to regenerate digital data at multi-gigahertz frequencies. These requirements press current integrated circuit technology capability to the limits, and problems of low power, integrated clock recovery mechanisms exist.

One technique which is used to maximize the rate at which data can be recovered in a given silicon technology is to use a 1:2 demultiplex circuit at the chip data input (J. Hauenschild et al., "A 22 Gb/s Decision Circuit and A 32 Gb/s Regenerating Demultiplexer IC Fabricated in Silicon Bipolar Technology", IEEE 1992 Bipolar Circuits and Technology Meeting, Paper 7.4). This can be accomplished, for example, by regenerating the data with two D-type flip-flops whose data inputs are connected to the incoming data, but whose clock inputs are clocked on the rising and falling edges of the clock, respectively. Thus, for example, a 2 Gb/s data stream could be regenerated by a 1 GHz clock.

In U.S. Pat. Nos. 5,185,581 (A. K. D. Brown, February 1993); 5,172,076 (A. K. D Brown, December 1992); and 5,371,475 (A. K. D. Brown, December 1994), all assigned to Northern Telecom Limited, a family of VCOs has been described which employs gyrator circuits using transconductors with built in delay. The primary application of these circuits is in silicon bipolar and bipolar HBT technology. The comparatively large transconductance of the bipolar transistors of the VCOs disclosed in the above patents permits oscillation of sufficiently high frequencies, and the built in delay of these transconductors is sufficient to maintain reliable oscillation.

U.S. Pat. No. 5,185,581 discloses a type of VCO which has quadrature phase outputs. By clocking four D-type flip-flops of the four phases of such a VCO and connecting the data inputs to a common data stream, a 1:4 demultiplex circuit is obtained. Such an arrangement would regenerate a 4 Gb/s data stream from a 1 GHz VCO.

In MOS technology, however, the transconductance is generally an order of magnitude less than in bipolar technology, so that the built in delay of the transistors is treated as a parasitic component (Krummenacher, "Design Considerations in High-Frequency CMOS Transconductance Amplifier Capacitor (TAC) Filters", 1989 IEEE International Symposium on Circuits and Systems) and is not sufficient to permit oscillation. The Krummenacher article describes CMOS harmonic oscillators which employ negative resistance transconductors to compensate for the gyrator loss admittance to provide an oscillator.

The present invention provides a novel MOS gyrator VCO architecture that does not require the transistors to have significant built in delay. In addition, the present invention uses a special four transconductor gyrator structure rather than the usual two. Further, the gyrator capacitors are connected as shunt Miller feedback capacitors over π/4 radians phase shift.

SUMMARY OF THE INVENTION

It is an object of the present invention to provide a CMOS differential amplifier (transconductor) which operates at microwave frequencies while achieving a high quality factor at low power and low noise.

The present invention also provides a microwave multiphase voltage controlled oscillator (VCO) built with a plurality of such CMOS differential amplifiers. The VCO of this invention may be used in circuits providing multiphase data regeneration where the number of data transitions exceeds the number of clock transitions in a given time period, and normal techniques for phase locked loop design do not apply.

The VCO CMOS oscillator of the invention is capable of oscillating at microwave frequencies with eight output clock phases suitable for providing timing for an 1:8 regenerating demultiplexing circuit. Thus, for example, if a silicon process would permit an eight phase oscillator to be designed with a maximum guaranteed frequency of 1 GHz, the process would nevertheless potentially support data regeneration up to 8 Gb/s using a totally integrated circuit. For example, co-pending U.S. patent application Ser. No. 08/565,266, filed Nov. 30, 1995, by the present inventor and entitled "A Microwave Multiphase Phase Detector" discloses a microwave multiphase phase detector which can be implemented in differential CMOS or Bipolar CML.

This invention also provides a MOS gyrator VCO architecture that does not require the transistors to have significant built in delay.

Accordingly, the invention is directed to a microwave differential amplifier comprising a first and a second MOS device, each connected with the source to a common bias node, the gates connected to an input port for receiving a differential input signal and with the drains connected to an output port for providing a differential output signal; feedback means for shifting the phase of the differential output signal with respect to the phase of the differential input signal with a predetermined phase difference, at a predetermined frequency; and means for establishing the operating point of each of the MOS devices in the linear region of the respective transfer characteristic.

The invention uses operation in the linear region of MOS amplifiers to advantage. Thus, if the amplifier is working in the linear region, in other words in its maximum transconductance mode, the frequency of the oscillation of the resulting gyrator VCO can be twice the frequency of a conventional saturating ring oscillator.

Advantageously, the device of this invention provides a low power, low noise, eight phase microwave CMOS VCO. The CMOS VCO disclosed herein has a high quality factor at GHz frequencies while providing multiphase data regeneration at a cost lower than, for example, the bipolar technology.

The following description refers to an eight phase VCO, however, gyrators with a higher number of phases may be obtained by cascading higher numbers of differential amplifiers according to this invention.

BRIEF DESCRIPTION OF THE DRAWINGS

The foregoing and other objects, features and advantages of the invention will be apparent from the following more particular description of the preferred embodiments, as illustrated in the drawings, where.

DESCRIPTION OF THE PREFERRED EMBODIMENT

1. Description of a Gyrator Implemented in Bipolar Technology

Prior Art

A brief description of a microwave differential amplifier and a corresponding gyrator implemented in bipolar technology is described for a better understanding of the present invention.

Figure 1:
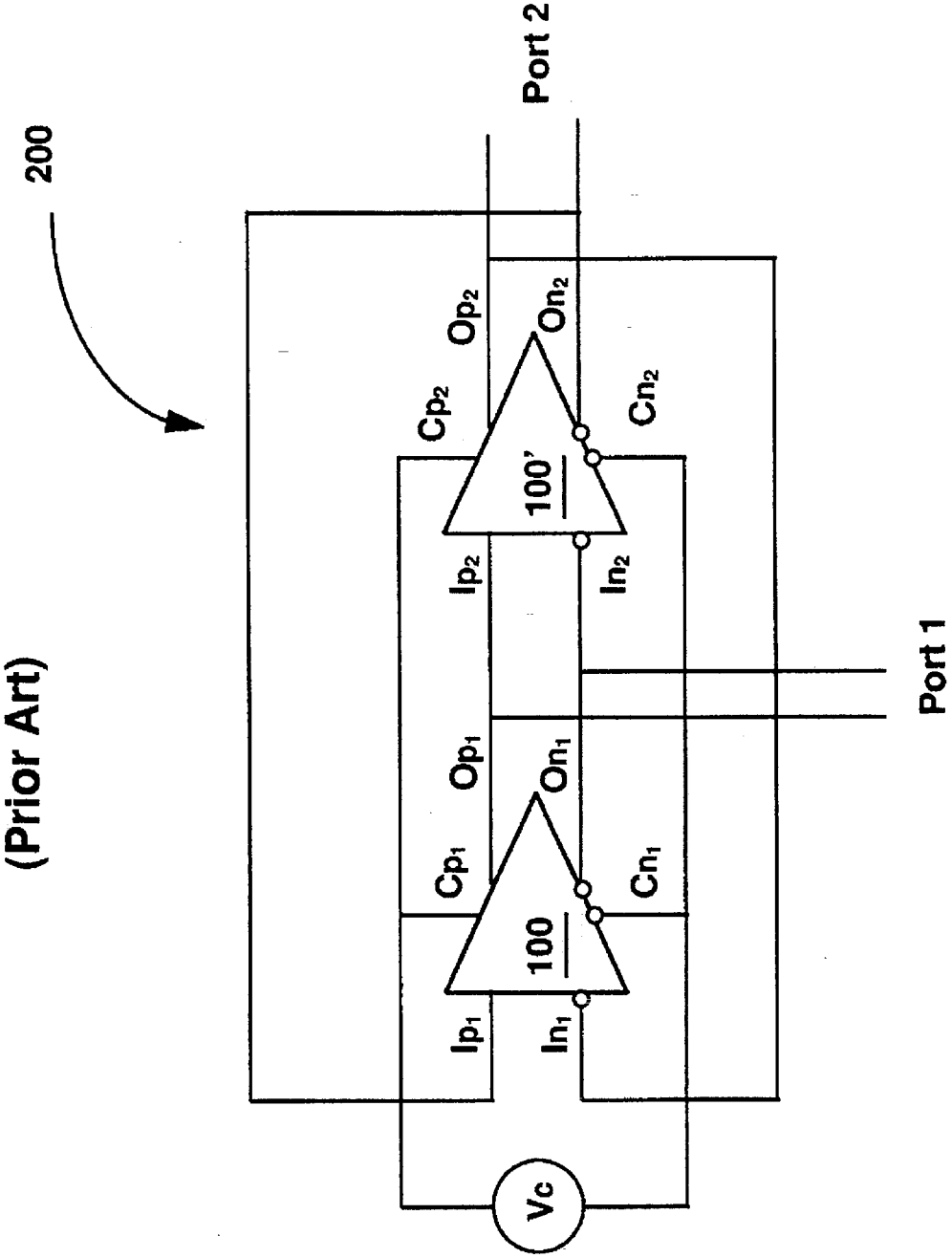
FIG. 1 is a block diagram of an oscillator gyrator model using 90° phase shift differential amplifiers.

FIG. 1 is a block diagram of a gyrator 200 using 90° phase shift differential amplifiers 100, 100' which are connected as a resonant circuit. Each differential amplifier receives a differential input Ip, In, and produces a differential output Op, On. The amplifiers are biased identically, so each contributes a 90° phase shift at the oscillation frequency.

The VCO 200 oscillates at a frequency where the series gain of the amplifiers 100 and 100' is greater than unity and the total phase shift contributed by the amplifiers 100 and 100' is 180°. While the positive and negative output terminals $O_{p1}$ and $O_{n1}$ of amplifier 100 are connected to the respective positive and negative input terminals $I_{p2}$ and $I_{n2}$ of differential amplifier 100', a further 180° phase shift is obtained from cross-coupling the positive and negative output terminals $O_{p2}$ and $O_{n2}$ of differential amplifier 100' to the negative and positive input terminals $I_{n1}$, $I_{p1}$ of differential amplifier 100. As the amplifiers are biased identically, each contributes with a 90° phase shift at the oscillation frequency, so that the clock phases are exactly π/2 radians apart.

Amplifiers 100, 100' may be of the type described in U.S. Pat. No. 5,185,581 (Brown), wherein each comprises a first and a second pair of matched transistors. When most of the bias current is steered to the first pair, the frequency response of the first pair dominates the frequency response of the gyrator. Similarly, when most of the bias current is steered to the second pair, the frequency response of the second pair dominates. The two pairs have a different frequency response due to the different size of their emitter areas. This is because generally the frequency responses of transistors are largely determined by the Miller capacitance, which is the inherent capacitance between the base and collector terminals of the transistor. This capacitance increases with the gain at a given frequency, and the gain increases with the emitter current density.

In the case of the two port gyrator circuit 200 as shown in FIG. 1, the capacitive impedance presented at one port is transformed into an inductive impedance at the other. If capacitors are placed at both ports, then the circuit becomes a parallel RLC resonant circuit. These capacitors are in fact connected to increase the Miller capacitance of the transistors of the differential pairs, so that the oscillation frequency range of the resulting VCO 200 is switched to a lower frequency band. The capacitors also lower the dependence of the amplifier circuit on the non-linear operating parameters of the transistors, thus increasing the quality factor (Q) of the VCO.

The oscillation frequency of the VCO is tuned by adjusting the differential voltage Vc applied between the control inputs Cp and Cn. VCO 200 can be tuned from approximately 0.75 GHz to approximately 1.4 GHz with a bias voltage of approximately 2 V above ground level and control voltage differential from −75 mV to +75 mV. This range is practically adequate for circuit parameter variations resulting from manufacturing process variations. The multiphase VCO 200 shown in FIG. 1 may be used for obtaining quadrature phase clocks by taking the output of each port and its inverse.

2. Description of the Differential Phase Shift Amplifier and VCO According to the Invention The CMOS microwave multiphase VCO of the present invention differs from the prior art described above at least in the following respects:

a) no built in delay is required in the MOS amplifier, due to the use of a 45° phase shift across two amplifiers instead of a 90° phase shift across two amplifiers; and b) the tuning method does not employ variation of the Miller capacitance.

Further, the CMOS microwave VCO of the present invention differs from the prior art of conventional CMOS ring oscillators in that the amplifiers are designed to oscillate in the linear, non-saturating region at all times.

Figure 2B:
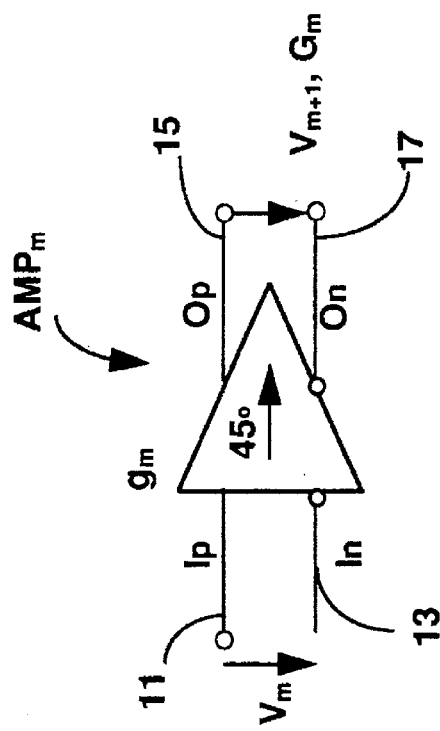
FIG. 2B is the symbol used for the 45° phase shift amplifier of FIG. 2A.
Figure 2A:
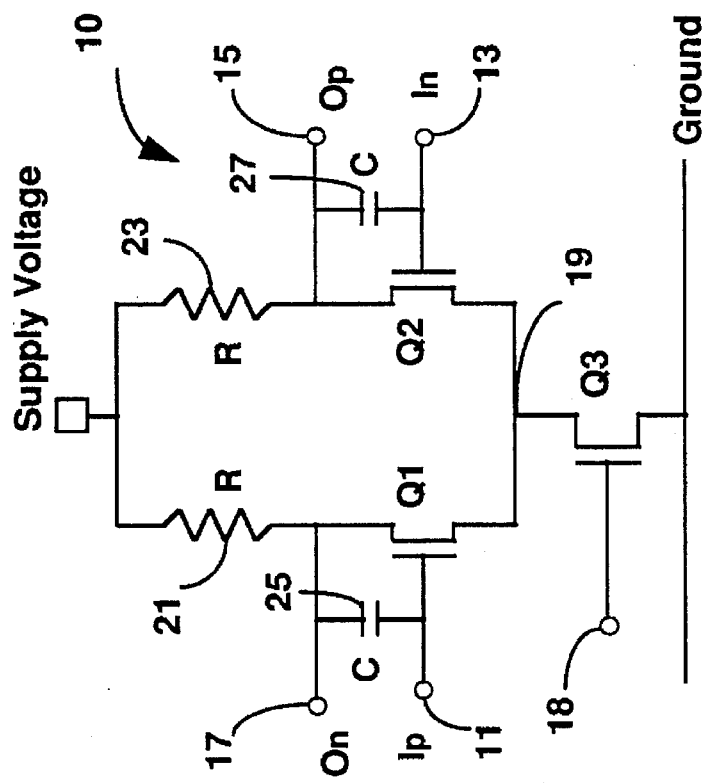
FIG. 2A illustrates a basic CMOS 45° phase shift amplifier (transconductance amplifier) according to the invention.

The basic topology of a 45° phase shift amplifier is shown in FIG. 2A, and the symbol used for this basic element is shown in FIG. 2B. The embodiment of FIG. 2A does not comprise tuning elements.

Amplifier 10 is a transconductance amplifier which amplifies a differential input voltage Ip, In applied on terminals 11, 13 to a differential output Op, On provided on terminals 15, 17. Amplifier 10 comprises a matched pair of NMOS devices Q1 and Q2, with the gates connected to the respective input port 11, 13, the drains connected to the respective output port 15, 17, and the sources connected to a bias node 19. The bias current for devices Q1 and Q2 is set using a device Q3 connected between the ground terminal and the bias node 19. The operating point of Q1 and Q2 is set in the linear region by applying a corresponding voltage on terminal 18 for setting the current of Q3.

Matched loads 21 and 23 are connected to the output node, and are such that the pair Q1, Q2 works in the linear region for the respective bias current. In the embodiment of FIG. 2A, the loads are resistive.

Capacitors 25 and 27 shown between the input and output are feedback capacitors, which are selected to make the gyrator built with cascaded differential amplifiers 10 into a resonant circuit. In practice, the capacitors 25 and 27 can be simply the Miller capacitances of NMOS devices Q1 and Q2.

FIG. 2B illustrates the symbol for an amplifier $AMP_m$ as that shown in FIG. 2A. Index "m" is an integer which indicates the rank of a differential amplifier when connected to form a VCO according to this invention. The input differential voltage $V_m$ measured between input terminals 11 and 13 is amplified to an output differential voltage $V_{m+1}$, measured between the output terminals 15 and 17, $V_{m+1}$ being phase shifted with 45° with respect to $V_m$. The amplifier presents a transconductance $g_m$ (mho) between the input and output ports, and a loss admittance $G_m$ (mho) at the output port. Transconductance g is defined as the relationship between the drain current ($i_D$) and the gate—source voltage ($v_{GS}$) at a constant value of the drain—source voltage ($v_{DS}$). The loss admittance G is the $Y_{22}$ parameter which is primarily due to the load resistors of the amplifier and shunts its output.

Figure 3:
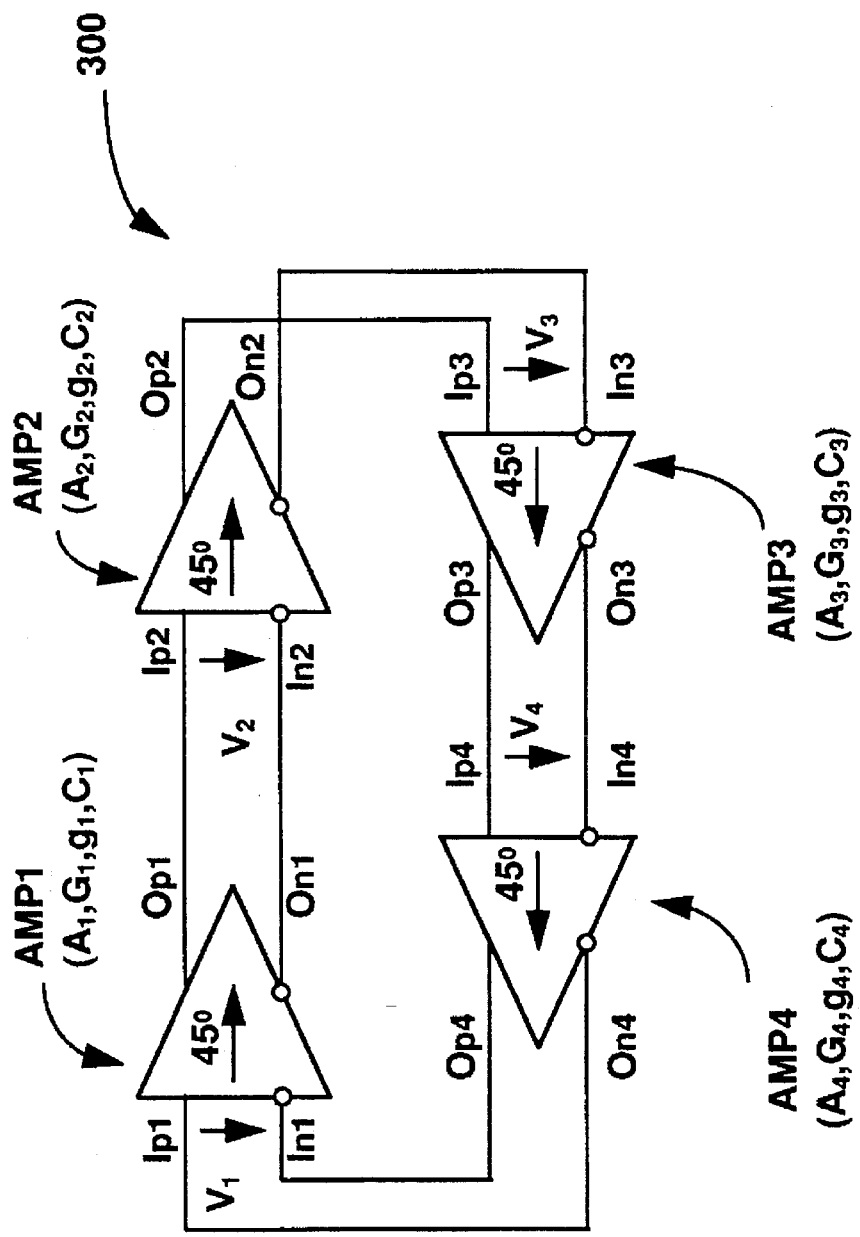
FIG. 3 shows a VCO with 45° phase shift across each transconductor.

FIG. 3 shows a gyrator resonator 300 built with four differential amplifiers 10 (transconductors) of FIG. 2A. In this embodiment m=1, 2, 3, or 4 and, accordingly, the differential amplifiers 10 are referred to as $AMP_1$ to $AMP_4$. Each differential amplifier $AMP_1$ to $AMP_4$ introduces a 45° phase shift between the input and output signal of the respective stage. For obtaining the correct phase at the input to the first amplifier $AMP_1$, an additional 180° phase shift is introduced by inverting one of the outputs before it is applied to the next input. In the example illustrated in FIG. 3, the additional 180° phase shift is obtained between $AMP_4$ and $AMP_1$ by wiring the positive output $O_{p4}$ of the amplifier $AMP_4$ to the negative input $I_{n1}$ of amplifier $AMP_1$, and the negative output $O_{n4}$ of amplifier $AMP_4$ to the positive input $I_{p1}$ of the amplifier $AMP_1$.

At first sight, the circuit of FIG. 3 resembles a ring oscillator: there are, however, important and fundamental differences as indicated above. Conventional CMOS ring oscillators employ saturating amplifier stages which, for a substantial part of the oscillation period, are at a fixed bistable logic level. Further, conventional ring oscillators are often tuned by means of a variable bias control which alters the amplifier propagation delay, and hence the period of the oscillation.

The circuit according to the invention differs from a classical ring oscillator mainly in that the amplifiers are employed in their linear region (i.e. non-saturating), and the oscillator cannot be tuned by control of the bias current. Since all the amplifiers of the VCO 300 are simultaneously working in their linear region, the loop possesses the properties of a fourth order gyrator which amplifies the noise floor at a loop resonant frequency to produce a narrow band spectral line or oscillation.

Since the amplifier stages are non-saturating, they are continuously employed in a maximum transconductance mode, thereby achieving a frequency which is typically twice as high as that of a conventional ring oscillator. For example, in a 0.8 micron CMOS process, classical ring oscillators have been reported with a maximum oscillation frequency of 900 MHz. In the same technology, an oscillation frequency of 1.6 GHz has been measured for this oscillator implemented in 0.8 micron CMOS. Since eight phases are available from this oscillator (two from each amplifier output), it is possible to drive a 1:8 regenerative demultiplexer circuit with an input data rate of 12.8 Gb/s. Of course, the ability to achieve a reliable demultiplexer depends upon such factors as inherent clock jitter, power supply noise, the degree to which the data-eye is open and upon the setup and hold delay times of the regenerating flip-flops. The intent of this invention is to provide for such a capability by means of a low power, low noise, microwave CMOS VCO.

Conditions for Oscillation

The following analysis proceeds to determine the conditions for unity loop gain at which the gyrator Q factor is infinite, and which is the limiting condition for oscillation.

The effect of the feedback capacitors 25, 27 of FIG. 2A on the input voltage is first determined. Assuming the input voltage is $V_m$, the output voltage is $V_{m+1}$, the voltage gain is $A_m$ and the feedback current is $I_F$, then the input impedance is given by:

$$Z_{IN_m} = \frac{V_m}{I_F} = \frac{V_m}{(V_{m+1} - V_m)j\omega C_m} = \frac{1}{(1+A_m)j\omega C_m} \quad \text{(EQ 1)}$$

This is equivalent to a shunt capacitance of magnitude $(1+A_m)C_m$, or the Miller capacitance.

Similarly for the output circuit with the output admittance $G_m$ and transconductance $g_m$, the output impedance Z can be calculated as:

$$Z_{OUT_{m+1}} = \frac{A_m}{(1+A_m)j\omega C_m + g_m} = \frac{1}{\left(1+\frac{1}{A_m}\right)j\omega C_m + G_m} \quad \text{(EQ 2)}$$

This is equivalent to a shunt capacitance across the load of magnitude $(1+1/A_m)C_m$. The above equations hold if the delays are assumed zero.

In the case of FIG. 3, the output voltage $V_{m+1}$ relative to the input voltage $V_m$ for an amplifier $AMP_m$, is given by:

$$V_{m+1} = \quad \text{(EQ 3)}$$

$$V_m g_m \left[ G_m + j\omega C_m \left[ 1 + \frac{1}{A_m} \right] + j\omega C_{m+1}(1 + A_{m+1}) \right]^{-1}$$

As indicated above, m is an integer taking values from 1 to 4 in the embodiment illustrated in FIG. 3.

If we use the notation:

$$G_m + j\omega C_m \left[ 1 + \frac{1}{A_m} \right] + j\omega C_{m+1}(1 + A_{m+1}) = D_{m,m+1} \quad \text{(EQ 4)}$$

the output $V_{m+1}$ of $AMP_m$ can be written:

$$V_{m+1} = \left[ \frac{V_m g_m}{D_{m,m+1}} \right] \quad \text{(EQ 5)}$$

so that the loop gain is given by:

$$\Gamma = \frac{-g_1 g_2 g_3 g_4}{D_{12} D_{23} D_{34} D_{41}} \quad \text{(EQ 6)}$$

If matching circuit elements are used, then $G_m=G$; $C_m=C$; $A_m=A$; and $g_m=g$ for all amplifiers. When we substitute $D_{m,m+1}$ in equation EQ 6, we obtain:

$$\Gamma = \frac{-g^4}{\left[ G + j\omega C(1+A) + j\omega C \left[ 1+\frac{1}{A} \right] \right]^4} \quad \text{(EQ 7)}$$

Note, the square roots of $-1$ are $\pm j$ and the fourth root of $-1$ are $$\pm\sqrt{\pm j} \text{ , or } \frac{\pm(1 \pm j)}{\sqrt{2}} \text{ .}$$

The condition for oscillation is unity gain, that is $\Gamma=1$; and the amplification of each transconductor 10 should be $$A = \frac{1+j}{\sqrt{2}}$$

for obtaining a 45° phase shift. Whence, taking the fourth root and making the substitutions in equation EQ 7, we can write for the unity gain:

$$\pm \frac{\sqrt{2}}{1 \pm j} = \left[ \frac{g}{G + j\omega C \left[1 + \frac{1+j}{\sqrt{2}}\right] + j\omega C \left[1 + \frac{1-j}{\sqrt{2}}\right]} \right] \quad \text{(EQ 8)}$$

so that:

$$g = \pm \left[ \frac{1 \pm j}{\sqrt{2}} \right] [G + j(2 + \sqrt{2})\omega C] \quad \text{(EQ 9)}$$

and, equating real and imaginary parts we obtain:

$$\omega = \pm \left[ \frac{\sqrt{2} \, g \pm G}{(2 + \sqrt{2})C} \right] \quad \text{(EQ 10)}$$

and:

$$\omega = \pm \frac{G}{(2 + 2\sqrt{2})C} \quad \text{(EQ 11)}$$

Using equations EQ 10 and EQ 11 we obtain:

$$g = \pm G\sqrt{2} \approx 1.414 G \quad \text{(EQ 12)}$$

EQ 12 gives the minimum value of g for oscillation. Note that g is advantageously independent of frequency.

Substituting $$G = \pm \frac{g}{\sqrt{2}}$$

from EQ 11 in EQ 12 we obtain:

$$\omega = \pm \frac{g}{C[4 + 2\sqrt{2}]} \approx \frac{g}{6.828 C} \quad \text{(EQ 13)}$$

For example, using normalized values, if we have a unity gain and $\omega=1$ rad/sec, and C=1F, we obtain g=6.828 mho and G=4.828 mho.

The value of the feedback capacitance C for operation at 1 GHz is determined from the equations given earlier. For a typical value of g of 1 mmho, the capacitance is nominally 0.1 pF. Since for a typical CMOS process the variation of MOS gate capacitance is proportional to the variation of the MOS transconductance, the capacitance C is best implemented as an MOS gate capacitance so that it is compensated for process variations.

Bias Control

As discussed, the differential amplifiers should be biased to operate in the linear region of the $i_{D\text{-}VGS}$ characteristic. On the other hand, in order to optimize the Q factor of the VCO, it is desirable that the transconductance g is slightly greater than the value specified for unity gain in EQ 12.

One way of overcoming this difficulty is to replace the fixed load resistor with a diode connected PMOS transistor whose size is chosen to approximately satisfy EQ 12.

Figure 4:
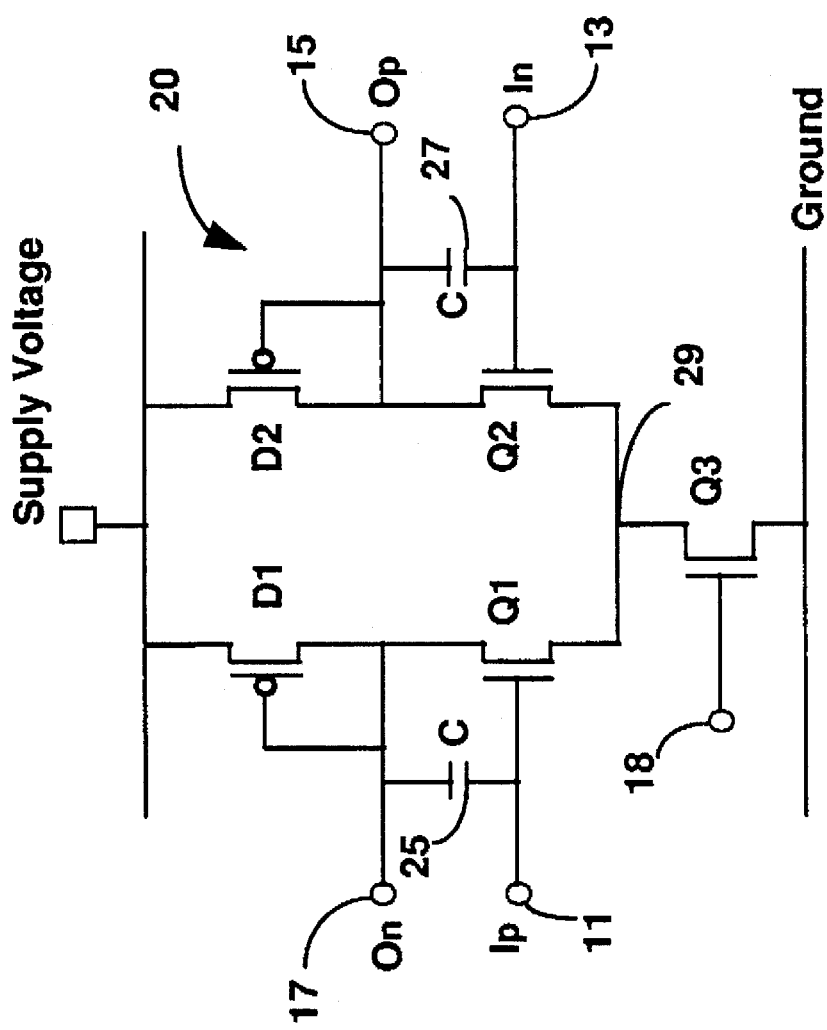
FIG. 4 is a basic 45° phase shift differential amplifier with active loads.

Such an amplifier 20 is shown in FIG. 4. Here, resistors 21 and 23 of FIG. 2A have been replaced with devices D1 and D2, respectively, which are connected as PMOS diodes. The gate and drain of D1 are connected to the negative output terminal 17, while the gate and drain of the device D2 are connected to the positive output terminal 15. The sources of D1 and D2 are connected to the power terminal.

The size of the PMOS transistors is determined according to the following analysis for obtaining a ratio g/G independent of the bias current. In a typical CMOS process the ratio of the transconductance of a NMOS transistor to that of a PMOS transistor might be about 2, for equally sized transistors. This is due in part to the difference in mobility of the PMOS and NMOS channels as well as the doping levels of the N and P wells. The sensitivity of the ratio of the transconductance of the NMOS transistor to that of the PMOS transistor in relation to the doping concentration depends upon the gate voltage being a maximum when the transistor enters the triode region. At the onset of saturation, the sensitivity is about 1. Thus, if transistors D1 and D2 are biased in the saturation region and the doping variations at the channels can be controlled, as a ratio, to within 5%, the transconductance ratio of the NMOS and PMOS transistors can be controlled to within 5%.

For example, if NMOS transistors Q1 and Q2 of the amplifier of FIGS. 2A or 4 have a gate length of 0.8 microns and a gate width of 100 microns, the corresponding PMOS transistor diode loads D1 and D2 would have a gate length of 0.8 microns and a width of 100*2.0/1.414=141 microns for approximately satisfying EQ 12. Given typical doping variations, it is possible that the PMOS transistor would be too lossy and the circuit would not oscillate. Therefore, the PMOS transistors D1 and D2 could be reduced by 10% to a gate width of 127 microns. In this way, the ratio of g/G will remain approximately constant under varied bias conditions, thus achieving our objective.

Figure 5:
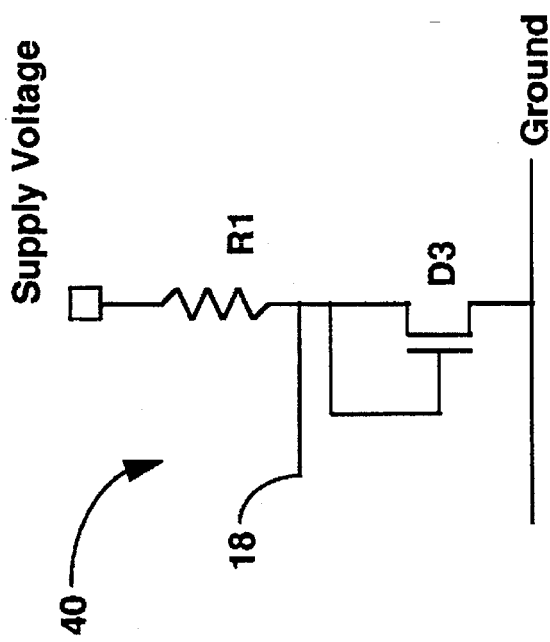
FIG. 5 shows the circuit diagram of a bias regulator for a transconductance amplifier.

A simple bias arrangement 40 is illustrated in FIG. 5, where the bias voltage is generated across a diode connected N-channel FET D3 and the current through the FET is determined by the voltage at the supply and the resistor R1. Thus, the current in transistor D3 is mirrored in transistor Q3 of FIG. 2A, transistor Q3 of FIG. 4, and transistors Q3 and Q7 of FIG. 8A, depending on the transistor sizes.

To calculate the VCO power in the load for a VCO built with differential amplifiers of FIG. 4, consideration should be given to the fact that VCO 300 has a distributed load consisting of 8 PMOS diode connected transistors. Under typical bias conditions of 1 GHz in a 0.5 micron CMOS process, the admittance of the PMOS transistor G=0.67 mmho, typical peak voltage swing is 0.5 Vpp or 0.176 Vrms, resulting in a power in the load of one PMOS transistor of 20.8 μW. The combined power in the load is 166 μW, or −7.8 dBm. The VCO power consumption is between 6 and 10 mW, depending upon the supply voltage, giving a maximum efficiency of about 2.5%. The noise figure of the VCO transconductors is about 12 dB from simulation. The combined effect of four transconductors is an additional impairment of 6 dB, giving a noise factor of 39.8. From this the effective Q factor of the oscillator can be calculated, using Robin's equation. Thus, $$Q_{EFF} = \frac{Q^2 \cdot 2P_{load}}{\pi F \, kT f_0} = \frac{9.06^2 \times 2 \times 166 \times 10^{-6}}{3.14159 \times 39.8 \times 1 \times 10^9 \times kT} \quad \text{(EQ 15)}$$

where F is the amplifier noise factor, k is the Boltzman constant, T is the absolute temperature, and $f_0$ is the frequency of oscillation of the gyrator.

Thus, for a typical oscillator at 1 GHz, the effective quality factor Q is 54,747, yielding a spectral line width of a free-running oscillator of 18 kHz. Note that in general, the spectral line width is less in a PLL application where the oscillator is locked to a stable reference.

Since the transconductance g is proportional to the bias current, and if G is obtained by a fixed load resistor as shown in FIG. 2A, the condition specified by EQ 12 cannot be guaranteed without automatic gain control (AGC).

AGC could be used to operate the amplifier within its approximately linear range and to control the circuit bias for constant signal amplitude. To accommodate variations due to processing, etc. and to adjust the circuit parameters to more closely satisfy EQ 12, the signal amplitude is kept within the approximately linear range of the transconductor, so that harmonic distortion components are kept lower than −26 dB reference carrier.

In practice, is desirable to develop a large oscillator output signal to reduce the phase noise. At the same time it is desirable to approximate as closely as possible the small signal unity gain conditions. These requirements are somewhat contradictory and a compromise can be obtained by using AGC. Single ended signal amplitudes of at least 0.5 volt peak to peak can be obtained in a 0.8 micron CMOS process.

AGC can be employed by control of the bias current without altering the oscillation frequency. The resonant frequency of gyrator 300 given by equation EQ 10 is proportional with the ratio g/C. On the other hand C, which is essentially the Miller capacitance, is also proportional with g, so that the ratio g/C is practically constant as the bias is varied.

Figure 6:
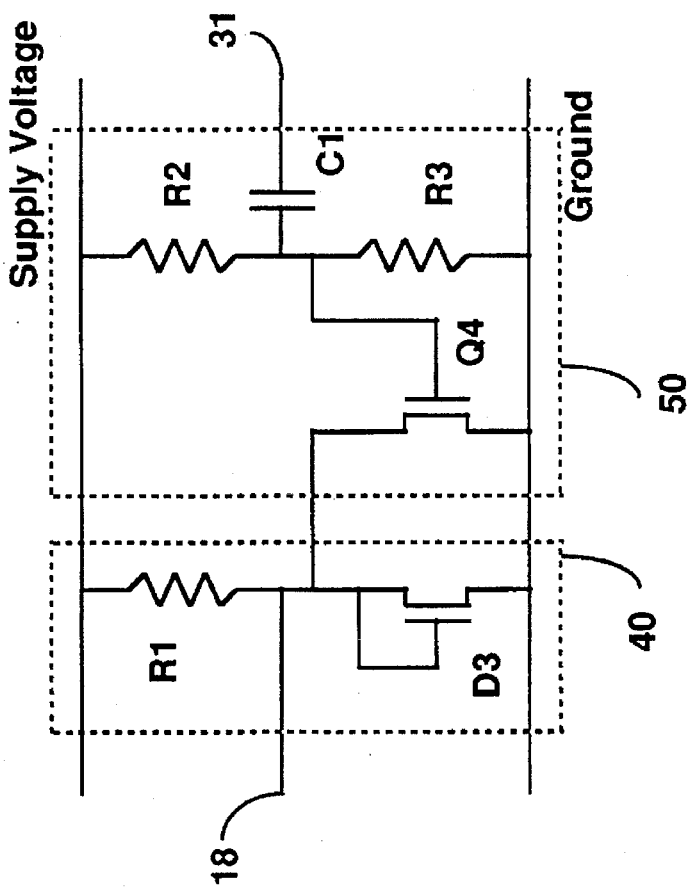
FIG. 6 illustrates the schematic of the bias voltage and AGC control system.

FIG. 6 illustrates an example of an AGC circuit 50 used in conjunction with the bias arrangement 40 for the differential amplifier shown in FIG. 2A. Input 31 is connected to one of the VCO outputs. Transistor Q4 is biased "off" by resistors R2 and R3 until the oscillator output applied to 31 causes the gate voltage of Q4 to momentarily rise above the transistor threshold voltage. When this happens, the transistor Q4 conducts and draws away some of the current supplied by resistor R1. As a result, the bias voltage is regulated to provide AGC.

In this arrangement, the resonator Q factor can be calculated as a cascade of two resonators. Using Grebene's formula for the Q factor of a classical gyrator, the Q factor without a negative impedance is given by:

$$Q = \frac{g^2}{2G\sqrt{g^2 + G^2}} \quad \text{(EQ 14)}$$

Substituting the values for g=6.828 mho and G=4.828 mho for unity gain calculated above, and allowing 10% reduction of G for process variation, we obtain a resonator Q factor of 0.652. However, due to the negative impedance introduced by the circuit delay and feedback, and the close approximation to unity loop gain at the resonant frequency, a Q enhancement factor can be calculated as 10 due to the 10% reduction of G from the ideal value and 20 due to the harmonic distortion non-linearity of −26 dB. The combined effect of these degradations from the ideal is a Q enhancement factor of 8.944, or an effective single resonator Q factor of 5.83. However, since the oscillator resonator is equivalent in structure to two cascaded resonators with a Q factor of 5.83, the combined Q factor is 9.06.

Figure 7:
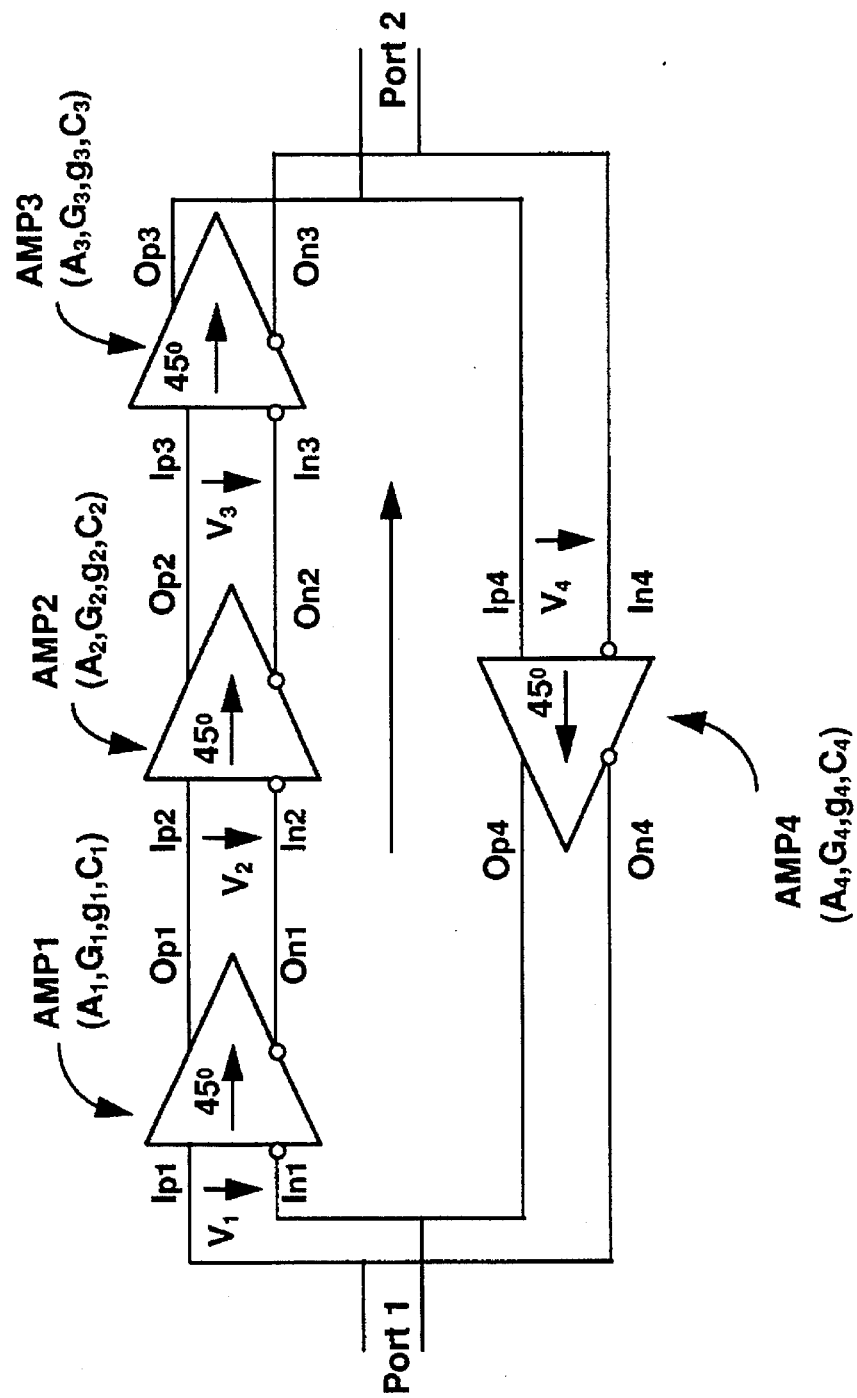
FIG. 7 is a multiphase two port resonator circuit with unidirectional gain.

Another configuration of the gyrator resonator as a two port resonator having unidirectional gain for use in multiple resonator oscillator structures is given in FIG. 7. In this configuration, the property of multiphase outputs is not lost in any way. The arrangement is useful for enhancing the quality factor of the VCO so as to obtain a sinusoid output signal with very low harmonic distortion. Such a property can be of value in a multiphase data regenerative demultiplexer where the low jitter clock requirements necessitate a maximum slew rate of the clock voltage at the switching point. The resonant two port circuit of FIG. 7 can be connected with advantage in a ring of 12 such resonators having a ring wired 180° phase reversal and 45° phase shift across each resonator. Of course, other combinations which meet this objective are possible.

Tuning of the Oscillator Frequency

A CMOS gyrator oscillator 300 as shown in FIG. 3 can be built with variable load amplifiers, as illustrated in FIG. 4. However, such a VCO cannot be tuned by variation of the bias of the amplifiers. The reason for this is that the resonant frequency of gyrator 300 according to EQ 10 is proportional to the ratio g/C. The gyrator capacitance C, which in this case is dominated by the Miller capacitance, is also proportional with g, so that the ratio g/C remains substantially constant as the bias is varied and tuning cannot be achieved in this way. An alternative tuning method must be employed.

A tuning mechanism that may be used for this VCO is based on applying feedback current components of ±90° phase shift in a controlled manner to combine with the current output of a previous transconductor.

Figure 8A:
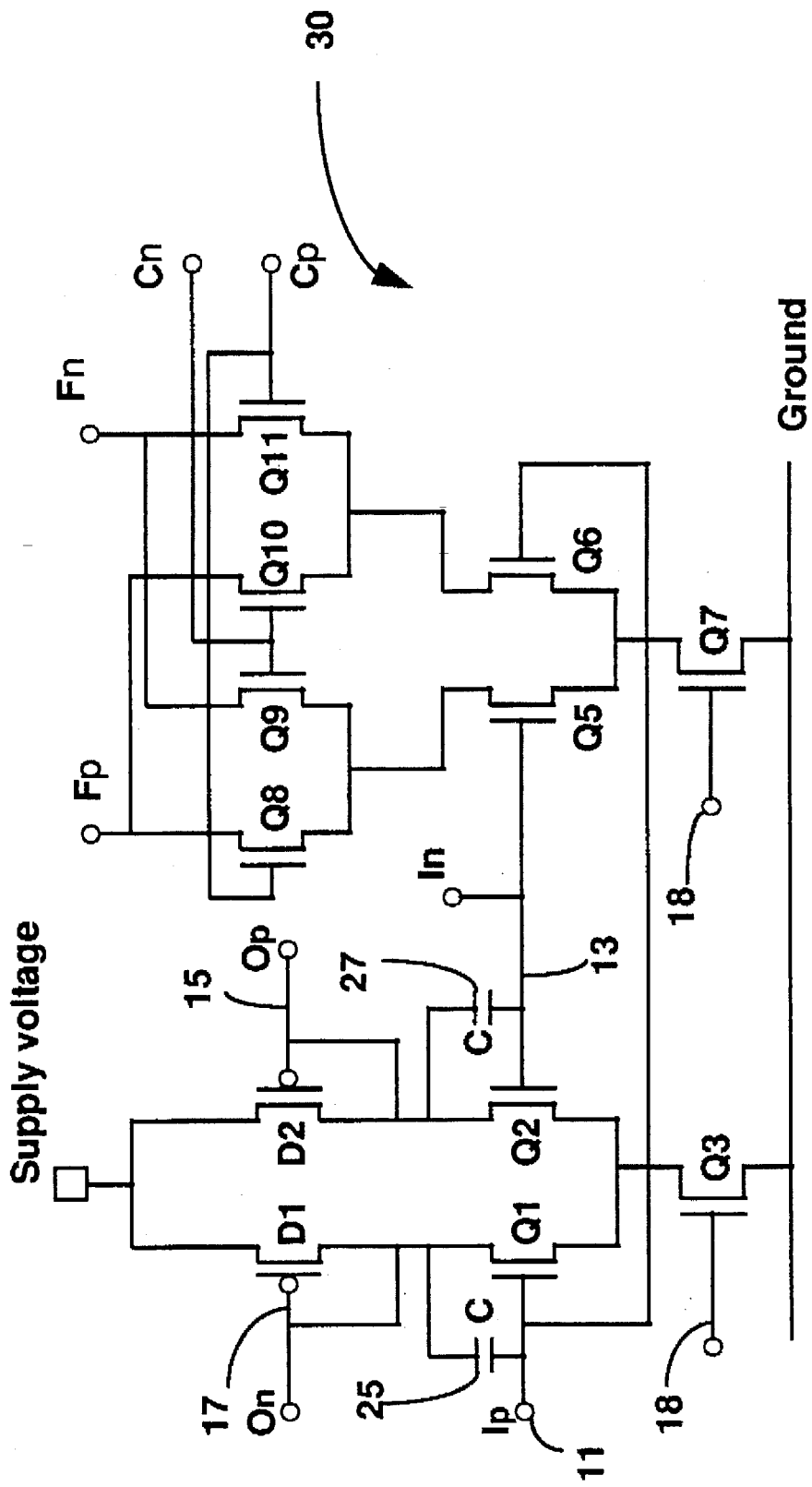
FIG. 8A illustrates a 45° phase shift amplifier with tuning control.
Figure 8B:
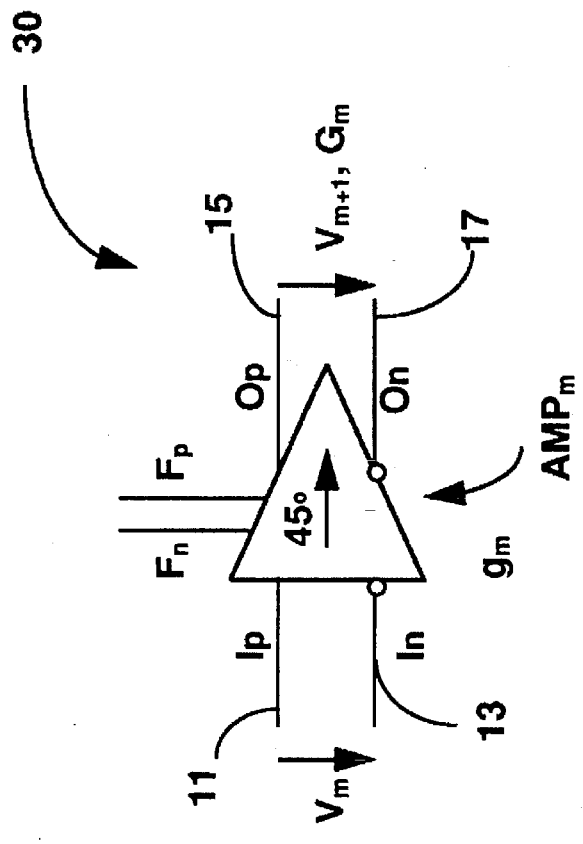
FIG. 8B is the symbol used for the amplifier of FIG. 8A.

FIG. 8A illustrates a 45° phase shift differential amplifier 30 with tuning control using feedback, while FIG. 8B shows the symbol used for the amplifier of FIG. 8A.

Amplifier 30 has a differential input In, Ip, a main differential output On, Op, and an auxiliary feedback output Fp, Fn. The main amplifier comprises a differential pair composed of NMOS transistors Q1, Q2 and NMOS current mirror Q3. The load impedance for the differential pair is provided by diode connected PMOS transistors D1, D2. Miller feedback capacitors 25 and 27 control the nominal center frequency of the VCO in conjunction with the bias current.

The circuit of FIG. 8A also comprises an auxiliary amplifier including transistors Q5 and Q6 and current mirror Q7. The inputs of the auxiliary amplifier are connected to the same inputs as the main amplifier. The auxiliary amplifier outputs are connected to outputs Fn, Fp via a multiplier circuit comprised of NMOS transistors Q8, Q9, Q10, and Q11. The purpose of the multiplier circuit is to control the magnitude and sign of the auxiliary output in accordance with the magnitude of the voltage on the multiplier control inputs Cn, Cp. These multiplier inputs Cp, Cn serve as tuning control inputs for the VCO and all the amplifier controls Cp, Cn are connected in parallel for this purpose. The maximum and minimum frequencies of the VCO correspond to the maximum tuning voltage which may be presented to the controls Cn, Cp.

When the maximum voltage of either polarity is presented to Cn, Cp, then the full differential current of Q5, Q6 appears at the output Fn, Fp. It will be observed that this maximum current is provided by the mirror Q7, while the maximum output differential current of Q1, Q2 is provided by mirror Q3. Also, it will be observed that devices Q3 and Q7 form part of the same current mirror. Therefore, the ratio of the outputs from the auxiliary and main amplifiers is a fixed maximum determined by the ratio of the transconductance of Q7 to Q3. If these transistors have the same gate length, then the ratio is the ratio of the respective gate widths.

Figure 9A:
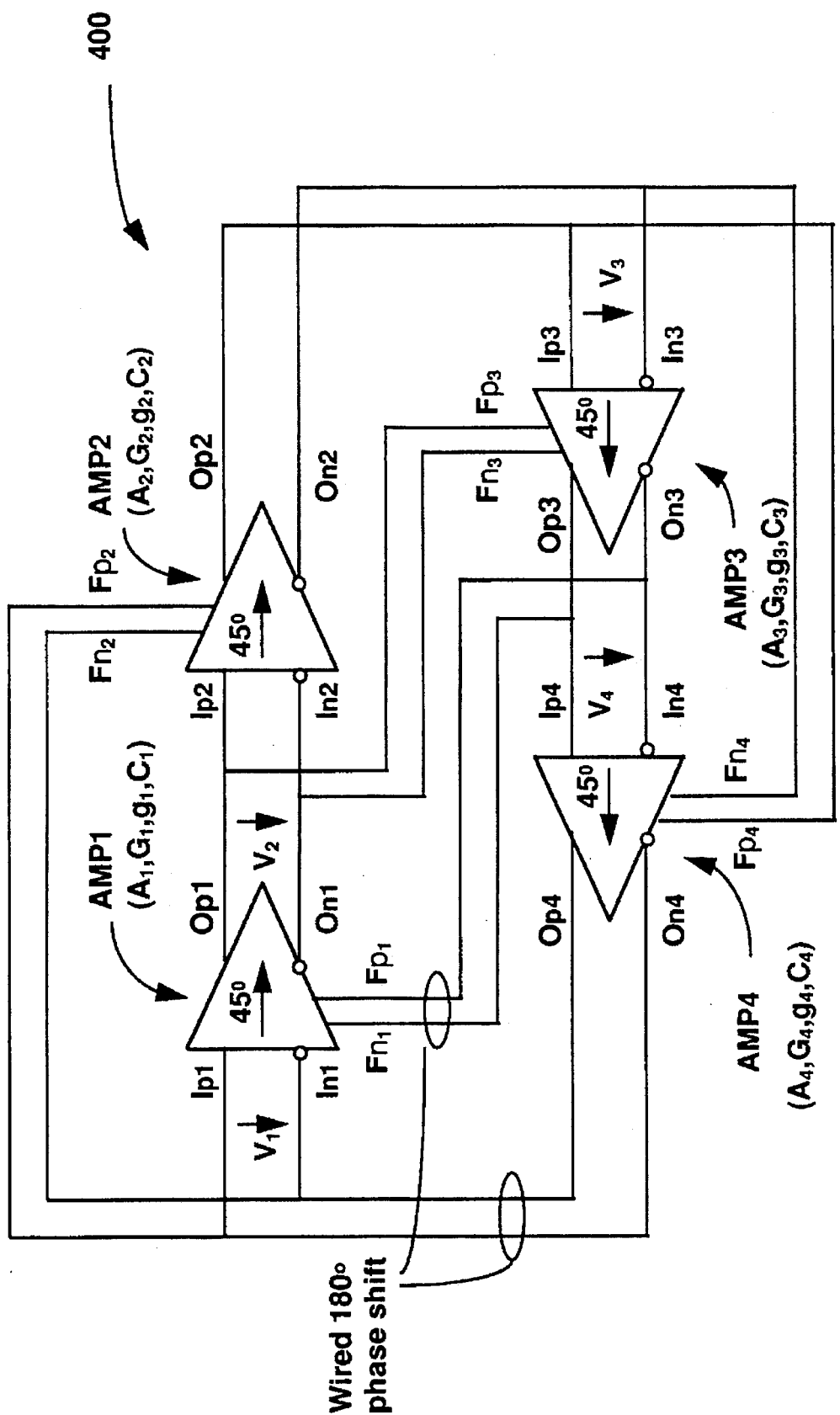
FIG. 9A illustrates a VCO comprising transconductance amplifiers with tuning control.

In the present invention, the feedback current of the auxiliary amplifier is summed in quadrature with the output current of a preceding amplifier as depicted in FIG. 9A, showing a VCO 400 built with four amplifiers as shown in FIG. 8A. Since the amplifiers each contribute a 45° phase shift, the feedback current must traverse two amplifiers of the loop to obtain the quadrature phase addition. Summation of the feedback current in quadrature with the main amplifier current achieves an effective variable delay in the amplifier by vector addition of the variable feedback current. As a result, since a variable delay is obtained for a 45° phase shift, the resulting oscillation frequency varies inversely with the delay. The tuning control terminals Cn and Cp are not illustrated in FIGS. 8B and 9A for clarity; they are connected in parallel in a conventional mode.

In the case of the CMOS VCO described here, with 45° phase shift across each of four transconductors, the feedback currents are applied to the input of the transconductor which is spaced two transconductors before the feedback outputs, thus achieving quadrature components of the feedback current. A total of four current feedback paths are employed in a preferred embodiment of the invention.

Figure 9B:
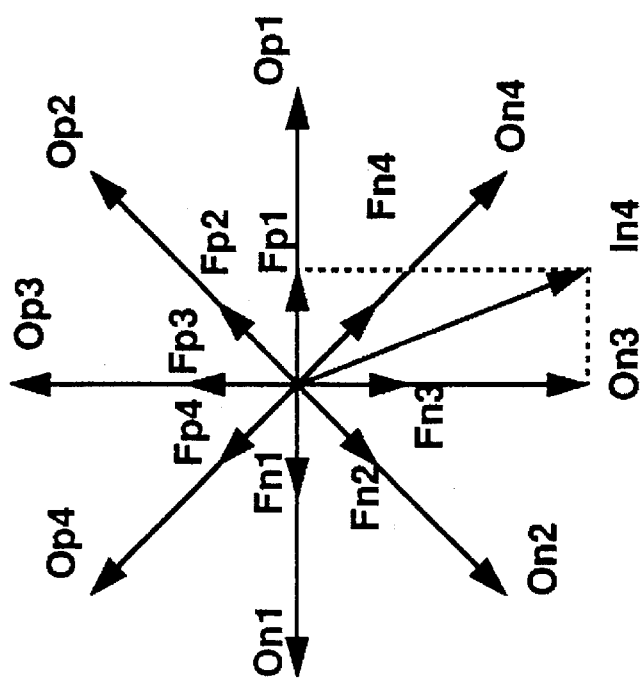
FIG. 9B is a phasor diagram illustrating the tuning control.

FIG. 9B illustrates the phasors $O_{pm}$, $O_{nm}$ for the differential output signal for all four amplifiers, and the respective feedback signals $F_{pm}$, $F_{nm}$. It is evident from FIG. 9B and Table 1 below how the feedback signals are connected to the output of an upstream amplifier in FIG. 9A.

TABLE 1

| Fp1 + On3 | Fn1 + Op3 |
| Fp2 + On4 | Fn2 + Op4 |
| Fp3 + Op1 | Fn3 + On1 |
| Fp4 + Op2 | Fn4 + On2 |

It will be clear that since the maximum feedback current is obtained as a ratio of the transconductance of NMOS mirror transistors Q7, Q3, the maximum tuning range of the VCO is also determined by the ratio of these transistors and is therefore fixed by physical geometry independent of process and temperature variations. This type of tuning arrangement is therefore superior to methods reported in prior art.

In this embodiment of the invention, a VCO with a tuning range of 1.1 GHz to 1.9 GHz has been implemented in 0.5 micron CMOS technology. Higher frequencies are possible in this technology by reducing the Miller capacitance.

While the invention has been described with reference to particular example embodiments, further modifications and improvements which will occur to those skilled in the art, may be made within the purview of the appended claims, without departing from the scope of the invention in its broader aspect.

What is claimed is:

1. A microwave differential amplifier comprising:
   a first and a second MOS device, each connected with the source to a common bias node, the gates connected to an input port for receiving a differential input signal and with the drains connected to an output port for providing a differential output signal;
   feedback means for shifting the phase of said differential output signal with respect to the phase of said differential input signal with a predetermined phase difference, at a predetermined frequency; and
   means for establishing the operating point of each of said MOS devices in the linear region of the respective transfer characteristic.

2. An amplifier as claimed in claim 1, wherein said first and said second devices are NMOS transistors.

3. An amplifier as claimed in claim 2, wherein said feedback means includes a first and a second capacitor, said first capacitor being connected between the gate and drain of said first NMOS transistor, and said second capacitor being connected between the gate and drain of said second NMOS transistor.

4. An amplifier as claimed in claim 3, wherein said first and said second NMOS transistors have a substantially identical transconductance (g) at said operating point, and said first and said second capacitors have a substantially identical capacitance (C).

5. An amplifier as claimed in claim 4, wherein said capacitance (C) is the Miller capacitance of said first and said second NMOS device.

6. An amplifier as claimed in claim 5, wherein each said NMOS transistor is sized to have the transconductance (g) about 1 mmho, and said capacitance (C) about 0.1 pF for setting said predetermined frequency at 1 GHz.

7. An amplifier as claimed in claim 2, wherein said means for establishing comprises:
   a third NMOS device connected between said common bias node and a ground terminal for receiving a bias signal on the gate and providing a substantially constant bias current into said common bias node; and
   a first and a second matched load impedance, each connected between a power source and a respective terminal of said output port.

8. An amplifier as claimed in claim 7, further comprising means for providing said bias signal.

9. An amplifier as claimed in claim 8, wherein said means for providing said bias signal comprises:
   a diode connected N-channel FET for generating said bias current; and
   a bias resistor with the resistance (R1) provided between said power source and the drain of said FET, for setting the value of said bias current as the ratio between the voltage of said power source and the resistance (R1).

10. An amplifier as claimed in claim 7, wherein said first and said second load impedances are resistors (R), sized to provide a substantially constant rate between the transconductance (g) and the loss admittance (G) of said amplifier.

11. An amplifier as claimed in claim 9, further comprising:
   automatic gain control (AGC) means for determining when said differential output signal is above a threshold voltage and reducing said bias current for reducing said differential output signal accordingly.

12. An amplifier as claimed in claim 11, wherein said AGC means comprises:
   a voltage divider connected between said power source and ground for providing said threshold voltage;
   a fourth NMOS device connected with the drain and source across said FET, and with the gate to said voltage divider for a nonconductive state of said fourth NMOS device; and
   means for applying a dc component of said output signal on the gate of said fourth NMOS device for commuting said fourth device to a conductive state when said dc component is greater than said threshold.

13. An amplifier as claimed in claim 7, wherein said first load impedance is a first diode connected PMOS device and said second load impedance is a second diode connected PMOS device, said first and second PMOS devices being sized to provide a substantially constant rate between the transconductance (g) and the loss admittance (G) of said amplifier.

14. An amplifier as claimed in claim 13, wherein the ratio between the transconductance (g) to the transconductance of any of said first and second diode-connected PMOS devices is slightly greater than $1/\sqrt{2}$.

15. An amplifier as claimed in claim 13, wherein said first NMOS device has a gate length of 0.8 micron, a gate width of 100 microns, and said first PMOS device has a gate length of 0.8 microns and a gate width of 127 microns.

16. An amplifier as claimed in claim 7, further comprising means for diverting a fraction of said differential input signal and producing a differential feedback signal in phase with said differential output signal.

17. An amplifier as claimed in claim 16, wherein said means for diverting comprises:

an auxiliary amplifier comprising a fifth and a sixth NMOS device, each connected with the source to an auxiliary bias node, the gate to said input port for receiving said differential input signal and the drain connected to an auxiliary output port for providing said differential feedback signal;

a seventh NMOS device connected between said auxiliary bias node and said ground terminal for receiving said bias signal on the gate and diverting a portion of said bias current from said differential amplifier; and a first and a second multiplier circuit, each connected to the drain of said fifth and sixth NMOS device, respectively, for producing said feedback signal Fpm, Fnm in accordance with a differential control signal Cp, Cn.

18. An amplifier as claimed in claim 17, wherein said portion of bias current is dependent on the ratio between the transconductance of said third and said seventh device.

19. An amplifier as claimed in claim 17, wherein:

said first multiplier circuit comprises an eight and ninth NMOS device connected with the sources to the drain of said fifth device, with the gates to said differential control signal Cp, Cn, for producing said differential feedback signal Fpm, Fnm between the drains; and said second multiplier circuit comprises an tenth and eleventh NMOS device connected with the source to the drain of said sixth device, with the gates to said differential control signal Cp, Cn, and with the drains to said auxiliary output port for producing said differential feedback signal Fpm, Fnm.

20. A multiphase (2×M) microwave voltage controlled oscillator (VCO) for regeneration of high rate data, comprising:

a plurality (M) of CMOS microwave differential amplifiers $AMP_m$ as claimed in claim 2, where m is an integer and m∈[1, M], each amplifier introducing a predetermined phase difference (∅) between a respective differential input signal Ipm, Inm and a respective differential output signal Opm, Onm, (M) amplifiers introducing a total phase shift (M×∅);

means for connecting said (M) amplifiers in a cascade configuration with each output port of an amplifier $AMP_m$ directly wired to a respective input port of a next amplifier $AMP_{m+1}$; and means for obtaining a ring configuration by connecting said output port of amplifier $AMP_M$ with said input port of amplifier $AMP_1$ for introducing an additional phase shift (360°−M×∅).

21. A VCO as claimed in claim 20, with the total gain greater than unity at said predetermined frequency for supporting oscillations.

22. A VCO as claimed in claim 20, wherein the gain of each amplifier $AMP_m$ is substantially equal to unity, resulting in a predetermined phase difference (∅) of 45°.

23. A VCO as claimed in claim 20, further comprising tuning means, for varying said predetermined frequency according to a differential control signal.

24. A VCO as claimed in claim 23, wherein said tuning means comprises:

means at each amplifier $AMP_m$ for diverting a fraction of said respective differential input signal Ipm, Inm in response to a control signal Cp, Cn, and producing a differential feedback signal Fpm, Fnm, said feedback signal being in phase with said differential output signal Opm, Onm; and means for summing each of said differential feedback signal Fpm, Fnm with said differential output signal Op(m−2), On(m−2) which is in quadrature with said differential feedback signal Fpm, Fnm.

25. A VCO as claimed in claim 20, for a resonant two port circuit further comprising;

a first VCO port provided between said input port of amplifier $AMP_M$ and output port of amplifier $AMP_{M−1}$; and a second VCO port provided between said input port of $AMP_1$ and said output port of $AMP_M$.

26. A multitude of resonant two port circuits as claimed in claim 25, arranged in a ring configuration.

* * * * *